(12) United States Patent
Xu et al.

(10) Patent No.: US 11,832,494 B2
(45) Date of Patent: Nov. 28, 2023

(54) DISPLAY PANEL AND DISPLAY DEVICE FOR THINNING A THICKNESS OF A DISPLAY

(71) Applicant: BOE TECHNOLOGY GROUP CO., LTD., Beijing (CN)

(72) Inventors: Chuanxiang Xu, Beijing (CN); Shi Shu, Beijing (CN); Qi Yao, Beijing (CN); Feng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 744 days.

(21) Appl. No.: 16/339,414

(22) PCT Filed: Nov. 9, 2018

(86) PCT No.: PCT/CN2018/114706
§ 371 (c)(1),
(2) Date: Apr. 4, 2019

(87) PCT Pub. No.: WO2019/137086
PCT Pub. Date: Jul. 18, 2019

(65) Prior Publication Data
US 2021/0375999 A1 Dec. 2, 2021

(30) Foreign Application Priority Data
Jan. 11, 2018 (CN) .......................... 201810029319.5

(51) Int. Cl.
*H10K 59/38* (2023.01)
*G06F 3/044* (2006.01)
(Continued)

(52) U.S. Cl.
CPC ........... *H10K 59/38* (2023.02); *G06F 3/0446* (2019.05); *H10K 50/844* (2023.02);
(Continued)

(58) Field of Classification Search
CPC . H01L 27/322; H01L 27/323; H01L 51/5284; H01L 27/3213; H01L 27/3218
See application file for complete search history.

(56) References Cited

U.S. PATENT DOCUMENTS 9,753,194 B2  9/2017  Lee et al.
2014/0035456 A1  2/2014  Isa
(Continued)

FOREIGN PATENT DOCUMENTS

CN  1469330  1/2004
CN  101424811  5/2009
(Continued)

OTHER PUBLICATIONS

International Search Report and Written Opinion dated Feb. 11, 2019 for PCT Patent Application PCT/CN2018/114706.
(Continued)

*Primary Examiner* — Nduka E Ojeh
(74) *Attorney, Agent, or Firm* — Perilla Knox & Hildebrandt LLP; Kenneth A. Knox (57) ABSTRACT

A display panel and a display device are provided, the display panel include a substrate, an EL display unit group and a filter layer. The EL display unit group is disposed on one side of the substrate, the EL display units includes a plurality of EL display units for emitting light of different colors; the filter layer is disposed on a light emitting side of the EL display unit, the filter layer includes a plurality of filters allowing lights of different colors to pass through, a light emitted from the EL display unit has a color same as a color of a light allowed to pass through the filter disposed on the light emitting side of the EL display unit.

19 Claims, 7 Drawing Sheets

(51) Int. Cl.
  *H10K 50/844* (2023.01)
  *H10K 50/856* (2023.01)
  *H10K 50/86* (2023.01)
  *H10K 59/40* (2023.01)
  *H10K 59/122* (2023.01)
  *H10K 59/35* (2023.01)

(52) U.S. Cl.
  CPC ......... *H10K 50/856* (2023.02); *H10K 50/865* (2023.02); *H10K 59/122* (2023.02); *H10K 59/351* (2023.02); *H10K 59/353* (2023.02); *H10K 59/40* (2023.02); *G06F 2203/04111* (2013.01)

(56) References Cited

U.S. PATENT DOCUMENTS

| | | | | |
|---|---|---|---|---|
| 2014/0117324 | A1* | 5/2014 | Kim | ............ G06F 3/0445 |
| | | | | 257/40 |
| 2015/0293280 | A1 | 10/2015 | Lee et al. | |
| 2015/0318447 | A1 | 11/2015 | Choi | |
| 2016/0233278 | A1* | 8/2016 | Yoon | ............ H01L 27/326 |
| 2016/0293670 | A1 | 10/2016 | Chen | |
| 2017/0005292 | A1* | 1/2017 | Lee | ............ H01L 51/5256 |
| 2017/0076678 | A1* | 3/2017 | Lee | ............ G02F 1/1336 |
| 2017/0090634 | A1 | 3/2017 | Yang et al. | |
| 2017/0155072 | A1 | 6/2017 | Hashimoto et al. | |
| 2017/0186823 | A1 | 6/2017 | Kim et al. | |
| 2017/0278899 | A1 | 9/2017 | Yang et al. | |
| 2017/0338293 | A1 | 11/2017 | Guo | |
| 2018/0061899 | A1* | 3/2018 | Oh | ............ H01L 51/5253 |
| 2018/0181240 | A1* | 6/2018 | Heo | ............ H01L 51/5284 |
| 2019/0131359 | A1* | 5/2019 | Kong | ............ G02F 1/136286 |
| 2019/0172887 | A1* | 6/2019 | Sun | ............ H01L 27/3272 |
| 2019/0243479 | A1 | 8/2019 | Wang | |
| 2020/0064973 | A1* | 2/2020 | Mitsui | ............ B32B 27/08 |
| 2021/0232250 | A1* | 7/2021 | Yang | ............ G06F 3/0445 |

FOREIGN PATENT DOCUMENTS

| | | |
|---|---|---|
| CN | 104347680 | 2/2015 |
| CN | 105355646 | 2/2016 |
| CN | 106157818 | 11/2016 |
| CN | 106935716 | 7/2017 |
| CN | 107219953 A | 9/2017 |
| CN | 108054191 | 5/2018 |
| CN | 207834302 | 9/2018 |
| EP | 3223122 A2 | 9/2017 |
| JP | 3876684 B2 | 2/2007 |
| JP | 2014044938 A | 3/2014 |
| JP | 2017173492 A | 9/2017 |
| KR | 101746412 B1 | 6/2017 |
| WO | 2018040735 | 3/2018 |

OTHER PUBLICATIONS

Office Action dated Jun. 5, 2019 for Chinese Patent Application 201810029319.5.
First Office Action for India Patent Application No. 201927034160 dated Jun. 7, 2021.
Extended European Search Report for EP Patent Application No. 18900186.0 dated Sep. 14, 2021.
First Office Action for Japanese Patent Application No. 2019-543319 dated Nov. 7, 2022.

* cited by examiner

DISPLAY PANEL AND DISPLAY DEVICE FOR THINNING A THICKNESS OF A DISPLAY

CROSS-REFERENCE TO RELATED APPLICATIONS

The present application is a § 371 national phase application of PCT/CN2018/114706, filed Nov. 9, 2018, which is based on, claims the benefit of, and priority to Chinese Application No. 201810029319.5, filed on Jan. 11, 2018, entire contents of which are hereby incorporated by reference.

TECHNICAL FIELD

The present disclosure relates to the technical field of display, and in particular, to a display device and a display panel.

BACKGROUND

Organic electroluminescent Device (OLED) has many advantages such as self-luminous, fast response, high brightness, thin size and the like with respect to a liquid crystal display device, which is considered to be the next-generation mainstream display technology, especially its bendable and flexible features make OLED the first choice for flexible displays.

OLED is a current injection type EL display device and has a sandwich structure composed of an anode, an emitting layer (EML for short) and a cathode. After power-on, the holes on the anode and the charge on the cathode are combined at the emitting layer so as to release the energy. The energy is transferred to the molecules of the organic emitting material, such that the molecules of the organic emitting material could transition from the ground state to the excited state. The excited molecules under very unstable excited state return to the ground state from the excited state, and the process of radiative transition produces luminescence. The OLED includes a metal layer (for example, the metal layer may be a cathode, or a reflecting layer between the anode and the substrate in the top-emitting OLED, etc., an anode in the top-emitting OLED), and a large amount of metal on the surface of the OLED has a high reflectivity to ambient light, and the reflected light will affect the display effect of the OLED.

BRIEF SUMMARY OF THE INVENTION

A display panel and a display device are provided in embodiments of the present disclosure, which can solve the problem of OLED having a large thickness and is not conducive to flexible bending due to the setting of a circular polarizer to block reflection in the relevant OLED.

For the above purposes, the following technical scheme is used in embodiments of the present disclosure.

In an aspect of an embodiment of the present disclosure, a display panel is provided, including: a substrate; a EL display unit group and a filter layer. The EL display unit group is disposed on one side of the substrate. The EL display units include a plurality of EL display units for emitting light of different colors. The filter layer, disposed on a light emitting side of the EL display unit, includes a plurality of filters allowing lights of different colors to pass through, where a light emitted from the EL display unit has a color same as a color of a light allowed to pass through the filter disposed on the light emitting side of the EL display unit.

Based on one embodiment, a color defining structure is provided between the adjacent filters, where the color defining structure is used for defining adjacent two filters.

Based on one embodiment, the color defining structure includes a black matrix; or the color defining structure is formed by edges of two adjacent filters overlapped with each other.

Based on one embodiment, the filter layer is carried by the substrate and the EL display unit is encapsulated by an encapsulating film layer.

Based on one embodiment, the filter layer is provided on a side of the EL display unit facing away from the substrate.

Based on one embodiment, the display panel further includes a touch structure, where the touch structure is disposed in the display panel and a projection of the touch structure on the substrate is located within a projection range of the color defining structure on the substrate.

Based on one embodiment, the touch structure includes a plurality of first touch electrodes parallel to each other and a plurality of second touch electrodes parallel to each other, where the plurality of first touch electrodes and the second touch electrodes are crossed and insulated from each other.

Based on one embodiment, the second touch electrodes include a plurality of second sub-touch electrodes spaced apart from the first touch electrodes and parallel at the same layer with the first touch electrodes, where the second sub-touch electrodes are connected by a bridge, and the bridge and the first touch electrodes are insulated from each other by providing an insulating layer or an insulating pattern.

Based on one embodiment, the first touch electrode and the second touch electrode are insulated from each other by the color defining structure.

Based on one embodiment, a pixel defining layer that includes a plurality of openings is further disposed on the substrate, where the EL display unit is disposed at the opening and the pixel defining layer is made of a light shielding material.

Based on one embodiment, a spacer is further disposed on the pixel defining layer, and a top surface area of the spacer is larger than a bottom surface area.

Based on one embodiment, a color defining structure is disposed between the adjacent filters, where the color defining structure includes a black matrix and a projection of the black matrix on the substrate corresponds to a projected position of the pixel defining layer on the substrate.

Based on one embodiment, the EL display unit is encapsulated by an encapsulating film layer. A buffer layer is further provided between the touch structure and the encapsulating film layer.

Based on one embodiment, a protective layer is further disposed on a side of the filter layer away from the EL display unit. The protective layer is adhered and fixed to a touch operation surface of the touch structure through optically transparent adhesive or pressure sensitive adhesive. The protective layer is configured to have one or more layers.

In another embodiment of the present disclosure, a display device is provided, including the display panel of any of the above.

Embodiments of the present disclosure provide a display panel and a display device including a substrate and a plurality of EL display unit groups provided on the substrate. The EL display unit group includes a plurality of EL display units for emitting light of different colors. A filter layer is provided on a light emitting side of the EL display unit, and the filter layer includes a plurality of filters allowing lights of different colors to pass through. The EL display unit emits a same color as the color of light allowed to pass through the filter provided on the light emitting side of the EL display unit. The filter layer, composed of the filter corresponding to the color of the EL display unit, is provided on the light emitting side of the EL display unit so that the natural light incident from the light emitting side first enters inside of the display panel through the filter layer. Only a large amount of light can be filtered through the filter layer of a single color of light, and a small part of the light entering the inside of the display panel loses a part of the light through the reflection of the metal material inside the display panel and the micro-cavity of the light-emitting unit, and again passes through the filter layer. The reflected light is filtered by the filter layer again, further reducing the intensity of the reflected light so that the intensity of the reflected light is very small, such that it is no longer necessary to provide a circular polarizer in the display panel to reduce the reflection. The effect of thinning the thickness of the display panel is achieved. When the display panel of the embodiment of the present disclosure is used for a flexible display, the thinned display panel is easily bent, and the folding function is facilitated.

BRIEF DESCRIPTION OF THE DRAWINGS

In order to more clearly explain the technical solutions in the embodiments of the present disclosure or the related art, the drawings to be used in the embodiments or the related art description will be briefly described below. The drawings in the following description are only some of the embodiments of the present disclosure, and those skilled in the art can obtain other drawings based on these drawings without any creative work.

DETAILED DESCRIPTION

The technical solutions in the embodiments of the present disclosure are clearly and completely described in the following with reference to the accompanying drawings in the embodiments of the present disclosure. It is understood that the described embodiments are only a part of the embodiments of the present disclosure, and not all of the embodiments. All other embodiments can be obtained by a person of ordinary skill in the art based on the embodiments of the present disclosure without departing from the inventive scope are the scope of the disclosure.

In the related art, a circular polarizer is generally provided on the light-emitting surface side of the OLED to reduce reflection. The ambient light incident from the light-emitting surface of the OLED passes through the circular polarizer and is converted into left-handed (right-handed) circularly polarized light. The left-handed (right-handed) circularly polarized light is reflected by the metal layer on the OLED, and the reflected circularly polarized light is right-handed (left-handed), which cannot be emitted through the circular polarizer, thereby reducing the reflection phenomenon of natural light on the OLED.

However, since the thickness of the circular polarizer itself is large and provided in the OLED, it is difficult to avoid the thickness of the entire OLED being large, the modulus of elasticity being large, and the brittleness being high, which is disadvantageous to the flexibility and flexibility and bendability of the flexible OLED.

Figure 1:
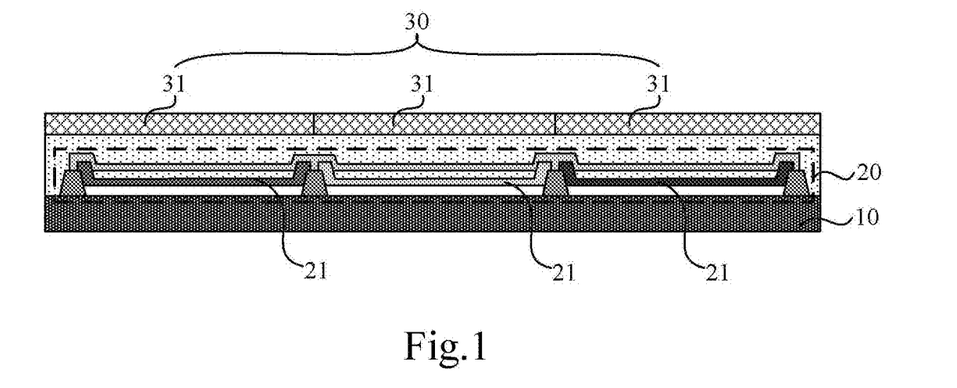
FIG. 1 is a first schematic view illustrating a hierarchical structure of a display panel according to an embodiment of the present disclosure.

An embodiment of the present disclosure provides a display panel, as shown in FIG. 1, includes a substrate 10 and an EL (electroluminescent) display unit group 20 provided on the substrate 10. The EL display unit group 20 includes a plurality of EL display units 21 for emitting light of different colors. A filter layer 30 is disposed on the light emitting side of the EL display unit 21, which includes a plurality of filters 31 for allowing light of different colors to pass through, and light emitted from the EL display unit 21 has a color same as the color of light allowed to pass through the filter 31 disposed on the light emitting side of the EL display unit 21.

Figure 2:
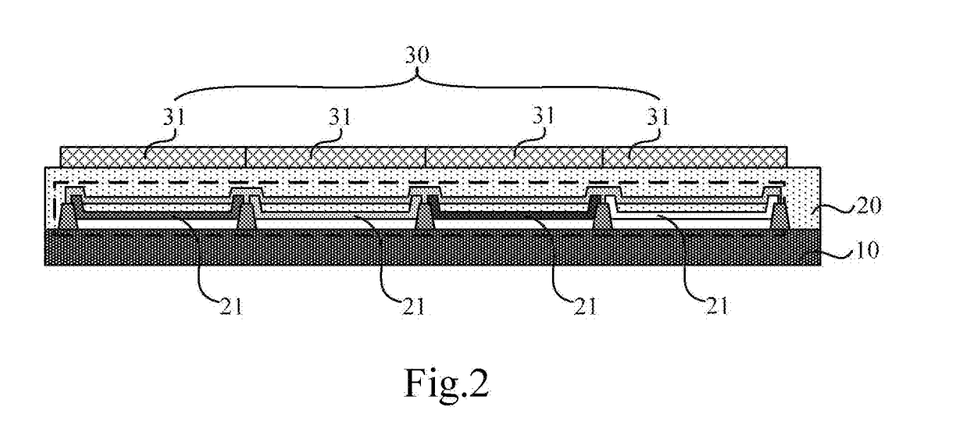
FIG. 2 is a second schematic view illustrating a hierarchical structure of a display panel according to an embodiment of the present disclosure.

It should be noted that, first, the plurality of EL display unit groups 20 provided on the substrate 10 includes a plurality of EL display units 21 for emitting light of different colors, wherein, in the embodiment of the present disclosure, the number of EL display units 21 constituting the EL display unit group 20, and the respective emitting colors of the a plurality of EL display units 21, are not specifically limited. For example, the display panel may be an RGB color display. As shown in FIG. 1, the EL display unit group 20 is composed of three EL display units 21 which include a red light-emitting EL display unit 21, a green light-emitting EL display unit 21 and a blue light-emitting EL display unit 21. Alternatively, the display panel may also be an RGBW color display. As shown in FIG. 2, the EL display unit group 20 is composed of four EL display units 21 which include a red light-emitting EL display unit 21, a green light-emitting EL display unit 21, a blue light-emitting EL display unit 21 and a white light-emitting EL display unit 21. Alternatively, the EL display unit group 20, composed of a plurality of other EL display units 21 emitting light of different colors, may be used as long as the color display of the display panel can be realized.

Second, as shown in FIG. 1, the filter layer 30 provided on the light-emitting side of the EL display unit 21 includes a plurality of filters 31 through which light of different colors is allowed to pass, and the filter 31 is provided correspondingly on the light emitting side of the each EL display unit 21. The filter 31 needs to allow the light of a corresponding color emitted from the EL display unit 21 under the projection of the filter 31 (below the projection as shown in the positional relationship in FIG. 1). Therefore, the light emitted from the EL display unit 21 has a color the same as the color of light allowed to pass through the filter 31 disposed on the light emitting side of the EL display unit 21. By way of example, the EL display unit group 20 can be composed of the red light-emitting EL display unit 21, the green light-emitting EL display unit 21, and the blue-emitting EL display unit 21. The filter 31 provided on the light-emitting side of the red light-emitting EL display unit 21 is a red filter 31, that is, only red light is allowed to pass through. Similarly, the filter 31 provided on the light-emitting side of the green light-emitting EL display unit 21 is a green filter 31, that is, only green light is allowed to pass through. The filter 31 provided on the light-emitting side of the blue light-emitting EL display unit 21 is a blue filter 31, that is, only blue light is allowed to pass through. When the EL display unit 20 further includes a white light-emitting EL display unit 21, the filter 31 provided on the light-emitting side of the white light-emitting EL display unit 21 is a transparent filter 31, that is, white light mixed with a variety of light is allowed to pass through.

Third, the correspondence between the EL display unit 21 and the filter 31 corresponding thereto is as long as the light emitted from the EL display unit 21 can be passed through the corresponding filter 31, and it is not strictly limited in the embodiment of the present disclosure that the shape is completely corresponding. The boundary of the projection the filter 31 on the EL display unit 21 has a size slightly smaller than the size of the EL display unit 21 or slightly larger than the size of the EL display unit 21.

Fourth, the EL display unit 21 includes an anode, a cathode, and a light-emitting layer between the anode and the cathode. The light-emitting layer includes an organic light-emitting layer or a quantum dot light-emitting layer or the like according to the principle of light emission. The organic light-emitting layer will be described as an example. For the EL display device, according to the light-emitting direction, it can be further divided into two kinds of top light emission and bottom light emission. Those skilled in the art would recognize that the difference between the top light emission and the bottom light emission only lies in the positional relationship of the cathode and the anode with respect to the light-emitting layer. The principle of light emission is the same. The following is an example of top light emission. In general, at least the metal anode in the EL display unit 21 and the reflective layer located between the anode and the substrate are prone to external natural light reflection phenomenon.

Fifth, the material of the substrate 10 in the embodiment of the present disclosure is not specifically limited. It may be a glass substrate or a flexible substrate. When the substrate 10 in the embodiment of the present disclosure is the flexible substrate, the function of bending or even folding may be facilitated. Those skilled in the art would recognize that the substrate 10 shown in FIG. 1 includes at least a flexible or glass substrate body and a backplane and a protective component thereof, fabricated on the substrate, for driving the EL display unit group 20 to be light-emitting, wherein, for example, the backplane may be an LTPS backplane, an Oxide backplane, or an organic TFT backplane. The protective component is adhered to the substrate 10 by a pressure sensitive adhesive or an optical transparent adhesive. The protective component may be made of polyimide (PI), polyethylene terephthalate (PET), polyethylene naphthalate (PEN), polyurethane (PU), polycarbonate (PC), and the like.

Sixth, in the embodiment of the present disclosure, the encapsulation mode of the display panel may be thin film or cover panel encapsulation, which is not limited thereto. In particular, the display panel may be encapsulated by a thin film after the EL display unit group 20 is completely formed on the substrate 10. Alternatively, the display panel may be encapsulated by the cover panel.

Embodiments of the present disclosure provide a display panel including a substrate and a EL display unit group disposed on the substrate, where the EL display unit group includes a plurality of EL display units for emitting light of different colors. A filter layer is disposed on a light emitting side of the EL display unit, and the filter layer includes a plurality of filters through which light of different colors is allowed to pass. The light emitted from the EL display unit has a color the same as the color of light allowed to pass through the filter disposed on the light emitting side of the EL display unit. The filter layer is composed of the filters having color corresponding to the color of the light emitted from the EL display unit, and is disposed on the light emitting side of the EL display unit, so that the external natural light incident from the light emitting side first enters into the internal of the display panel through the filter layer. A large amount of light will be filtered through the filter layer through which only light of a single color could pass, and a small part of the light entering into the internal of the display panel is reflected by the metal material in the display panel and the micro-cavity of the light-emitting unit with a part of the light lost. When again passing through the filter layer, the reflected light is filtered by the filter layer again, thereby further reducing the intensity of the reflected light so that the intensity of the reflected light is very small. Therefore, the effect of thinning the thickness of the display panel could be achieved without providing a circular polarizer in the display panel anymore. When the display panel of the embodiment of the present disclosure is used for a flexible display, the thin display panel is easily bent, and the folding function is facilitated.

Figure 3:
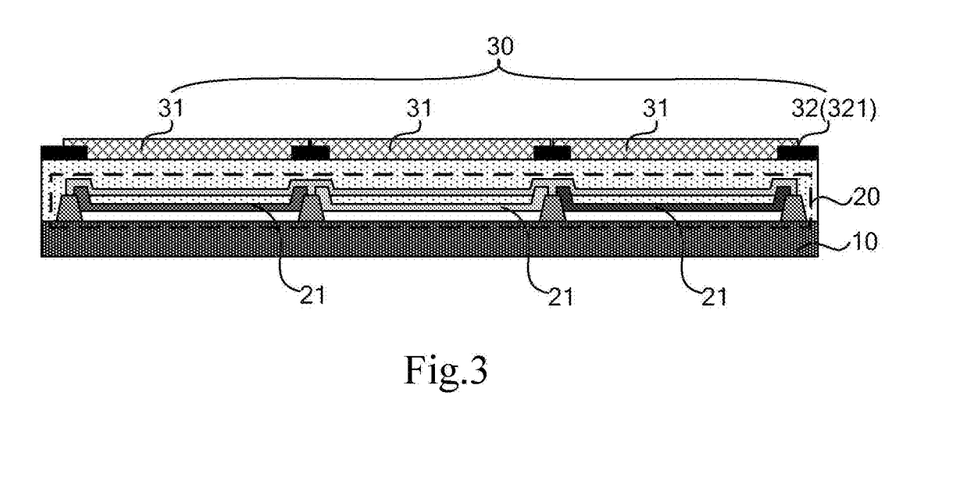
FIG. 3 is a third schematic view illustrating a hierarchical structure of a display panel according to an embodiment of the present disclosure.

As shown in FIG. 3, a color defining structure 32 is provided between adjacent filters 31 for defining two adjacent filters 31.

As shown in FIG. 3, while a plurality of filters 31 form the filter layer 30, the color defining structure 32 is provided between the two adjacent filters 31 so that, on the one hand, the setting of the color defining structure 32 can separate the colors of lights emitting from two adjacent pixel units to avoid color mixing and, at the same time, avoid light leakage at the joint part between the two adjacent filters 31, thereby improving the color rendering accuracy of the display panel. On the other hand, the color defining structure 32 is also capable of overcoming the reflection that occurs at the joint part between the two adjacent filters 31 when the natural light enters from the outside, preventing the display effect of the display panel from being affected due to the reflection of the natural light.

Figure 4:
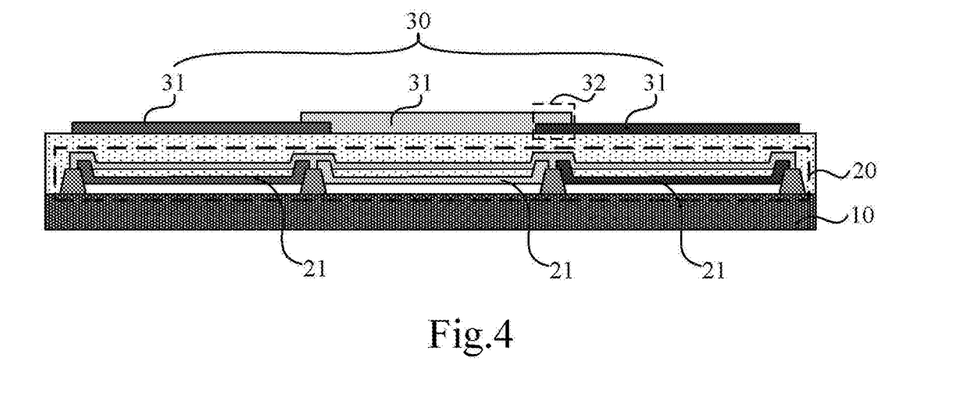
FIG. 4 is a fourth schematic view illustrating a hierarchical structure of a display panel according to an embodiment of the present disclosure.

Further, as shown in FIG. 3, the color defining structure 32 includes a black matrix 321 or, as shown in FIG. 4, the color defining structure 32 is formed by the edges of two adjacent filters 31 overlapped with each other.

As shown in FIG. 3, the black matrix 321 is provided between the two adjacent filters 31 as the color defining structure 32. The black matrix 321 is capable of absorbing light and, on the one hand, the light mixing problem of two adjacent pixel units occurring at the position of black matrix 321 can be avoided. On the other hand, the natural light reflected at the position of the black matrix 321 can be prevented from being emitted by the absorption of the black matrix 321.

Alternatively, as shown in FIG. 4, the color defining structure 32 is formed by the edges of the two adjacent filters 31 overlapped with each other. For example, the green filter 31 can only allow green light to pass through, and the light of other colors will be absorbed and cannot be emitted. The blue filter 31 can only allow blue light to pass through, and the light of other colors will be absorbed and cannot be emitted. The portion of the green filter 31 and the blue filter 31 overlapped with each other can be considered to form approximately the same effect as the black matrix 321, that is, blocking all light transmission where the black matrix 321 is not necessarily provided.

Figure 5:
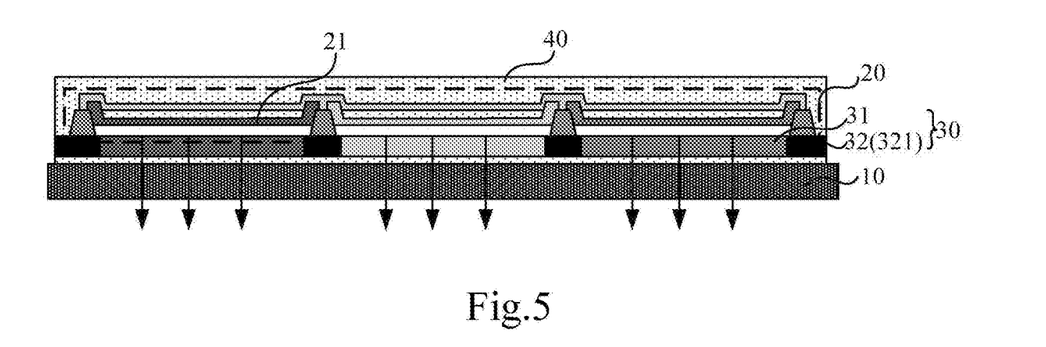
FIG. 5 is a fifth schematic view illustrating a hierarchical structure of a display panel according to an embodiment of the present disclosure.

As shown in FIG. 5, the filter layer 30 is carried by the substrate 10, and the EL display unit 21 is encapsulated by the encapsulating film layer 40.

As shown in FIG. 5, the filter layer 30 is carried by the substrate 10, that is, the filter layer 30 and the EL display unit group 20 are disposed one after another on the same substrate 10. Then, after the EL display unit group 20 including a plurality of EL display units 21 is fabricated, it is encapsulated by the encapsulating film layer 40. For example, the light emitting device of the display panel may be in the form of bottom light emission. That is, on the substrate 10, the filter layer 30 is formed first, and then the EL display unit group 20 is further fabricated on the substrate 10 on which the filter layer 30 is formed. The light emitted from each EL display unit 21 in the EL display unit group 20 has a color the same as the color of light capable of passing through the corresponding filter layer 30, and all the EL display units 21 are bottom light emission, that is, as shown by the arrow in FIG. 5, light is emitted toward the side of the substrate 10. The display panel in this way, in terms of the manufacturing process steps, includes first forming the filter layer 30 having the filter 31 and the color defining structure 32 on the substrate 10. Generally, during the fabrication of the filter layer 30, the material of the filter layer 30 is required to be high-temperature cured at a temperature greater than 200° C. After the filter layer 30, cured and formed at a high temperature, is fabricated, the anode layer, the light-emitting layer and the cathode layer in the EL display unit group 20 are fabricated, which avoids adverse effects of the high temperature environment on the hierarchical structure of the EL display unit group 20, thereby avoiding affecting the processing yield and display effect of the display panel.

Figure 6:
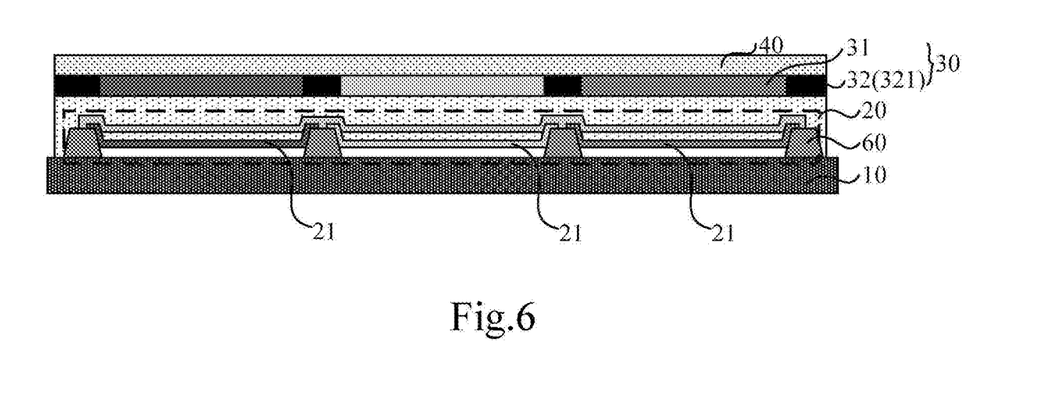
FIG. 6 is a sixth schematic view illustrating a hierarchical structure of a display panel according to an embodiment of the present disclosure.

Further, as shown in FIG. 6, the filter 30 layer is provided on a side of the EL display unit 21 facing away from the substrate 10.

As shown in FIG. 6, the light emitting device of the display panel adopts a top emission mode, and the EL display unit 21 emits light toward a side facing away from the substrate 10. The filter layer 30 is provided on a side of the EL display unit 21 facing away from the substrate 10, that is, the light emitting side of the EL display unit 21. The specific fabrication steps include: first fabricating a plurality of EL display unit groups 20 on the substrate 10, and then fabricating the filter layer 30 including the filter 31 on the substrate 10 on which the EL display unit group 20 is fabricated, wherein, the filters 31 match with the color of light emitted from the EL display unit 21. By changing the composition of the additive material in the material of the filter layer 30, the fabrication temperature of the filter layer 30 can be lowered to 100° C. or below, thereby avoiding the high temperature from damaging the already completed EL display unit group 20.

Figure 8:
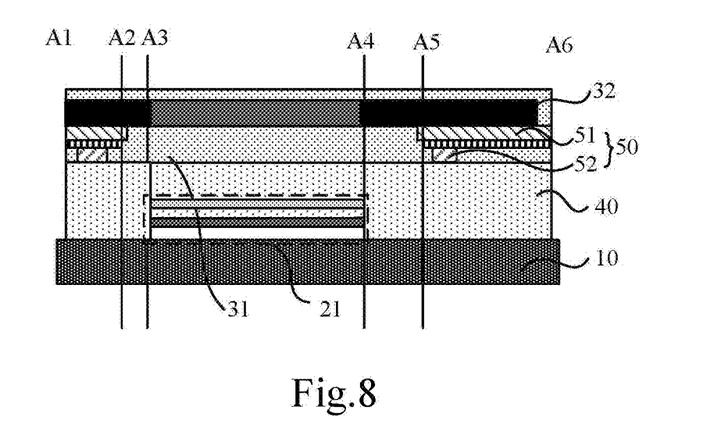
FIG. 8 is a first cross-sectional view taken along the fold line A1-A2-A3-A4-A5-A6 of FIG. 7.

As shown in FIG. 8, the display panel further includes a touch structure 50. The touch structure 50 is provided in the display panel and is disposed on a side of the encapsulating film layer 40 facing away from the substrate 10. In order to further reduce the reflection of the natural light from the touch structure 50 as shown in FIG. 8, the touch structure 50 is disposed on a side of the filter layer 30 adjacent to the substrate 10. The color defining structure 32 is provided between the adjacent filters 31 on the filter layer 30. The projection of the touch structure 50 on the substrate 10 is within the projection range of the color defining structure 32 on the substrate 10. The fabrication temperature of the touch structure 50 and the color defining structure 32 is also 100° C. or below.

Figure 7:
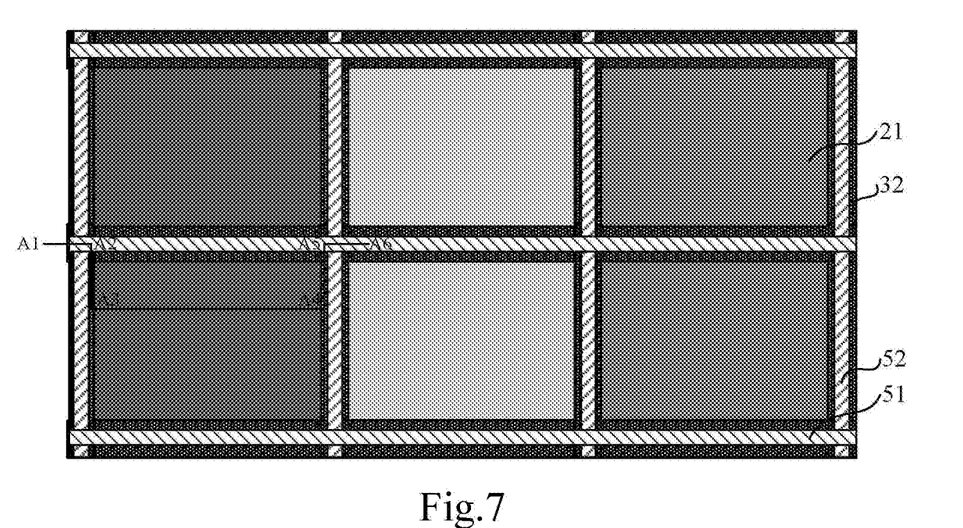
FIG. 7 is a first schematic view illustrating a panel structure of a display panel according to an embodiment of the present disclosure.

Further, as shown in FIG. 7, the touch structure 50 includes a plurality of first touch electrodes 51 parallel to each other and a plurality of second touch electrodes 52 parallel to each other, the a plurality of first touch electrodes 51 and the second touch electrode 52 are crossed and insulated from each other.

For example, the touch structure 50 of the embodiment of the present disclosure adopts a mutual capacitive touch, including crossed and mutually insulated touch and sensing electrodes, that is, the first touch electrode 51 and the second touch electrode 52 as shown in FIG. 7. The first touch electrode 51 and the second touch electrode 52 are insulated from each other and are spatially overlapped and intersected in a manner of intersecting rows and columns. Mutual capacitance is generated at each position where the first touch electrode 51 and the second touch electrode 52 spatially overlap and intersect each other. When the user performs the touch operation, at the position where the finger touches, a coupling capacitance is generated between the finger and the first touch electrode 51 (or the second touch electrode 52) above the finger due to the effect of the human body's electric field. The coupling capacitance will affect the capacitance value of the mutual capacitance between the first contact electrode 51 and the second contact electrode 52, thereby obtaining the coordinate information of the specific position where touch operation is performed at the touch structure 50 by finger.

The first touch electrode 51 and the second touch electrode 52 that are crossed and insulated from each other may be provided in different layers, or may be provided in the same layer. An electrical connection is made between two adjacent second touch electrodes 52 separated by the first touch electrode 51, or the electrical connection is made between two adjacent first touch electrodes 51 separated by the second touch electrode 52 by bridging. The specific setting mode of the touch structure 50 in the embodiment of the present disclosure is not limited. For example, as shown in FIG. 7, the first touch electrode 51 and the second touch electrode 52 are provided in different layers, and the first touch electrode 51 and the second touch electrode 52 are insulated from each other by an insulating layer.

It should be noted that, first, FIG. 8 is a cross-sectional view taken along the fold line A1-A2-A3-A4-A5-A6 of FIG. 7, and the cross-sectional view along the fold line direction of A1-A2-A3-A4-A5-A6 can exemplify the touch structure 50 and the vertical structure of the touch structure 50 and the EL display unit 21.

Figure 9:
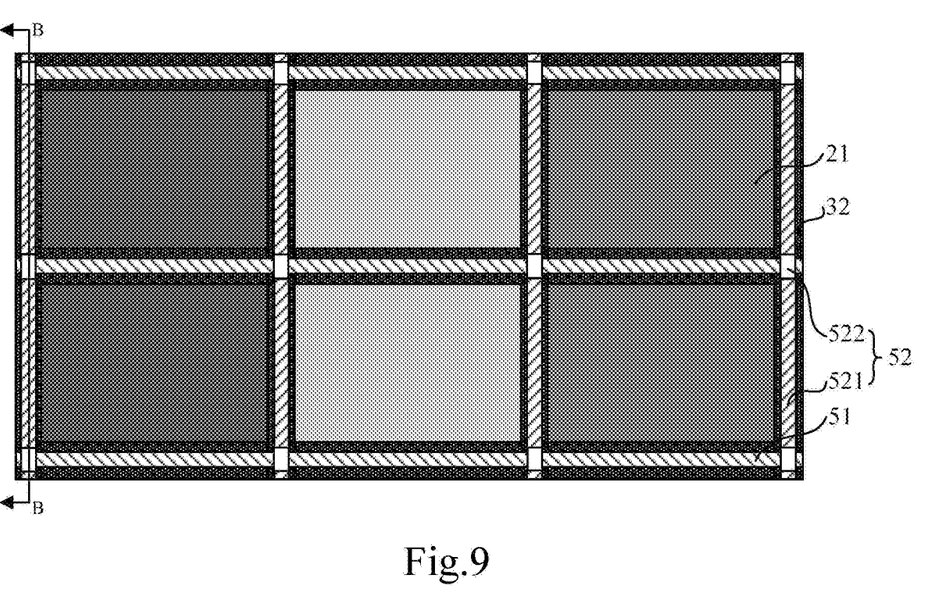
FIG. 9 is a second schematic view illustrating a panel structure of a display panel according to an embodiment of the present disclosure.

Second, those skilled in the art would recognize that when the touch structure 50 is provided on the display panel, one touch unit is much larger than one pixel unit. Generally, as the touch points of a touch operation of a finger or touch pen are large, they are generally not refined into a pixel unit, and the touch unit may include a range of hundreds of pixel units. In the embodiment of the present disclosure, the setting ratio between the touch unit and the pixel unit is not specifically limited, as long as it can satisfy the touch requirement. As shown in FIG. 7 and FIG. 9, for convenience of illustration, the schematic view is shown in which each touch unit corresponds to one pixel unit, but does not represent that the display panel in the embodiment of the present disclosure must be provided in such a structure. In addition, the pixel unit may not be limited to the rectangular shape as shown in FIG. 7 and FIG. 9, and may be a rhombic structure or the like, which is not specifically limited in the embodiment of the present disclosure.

Third, in the field of related thin-film encapsulation technology, in order to improve the encapsulation effect, the encapsulating film layer 40 is generally a multi-layer structure, and the basic level is triple-layer facility with the upper and lower inorganic layer sandwiched in the organic layer, that is, an inorganic layer/an organic layer/an inorganic layer. The inorganic layer may be a silicon nitride material, a silicon oxide material, a silicon oxynitride material or a composite layer made of the above materials, and the organic layer may be an acrylic resin material, an epoxy resin material or a composite layer of the above two materials. On this basis, in order to further improve the encapsulation effect, combined with the actual requirements for the encapsulating film layer in the specific display panel, it is also possible to add one or more layers of an atomic layer deposition (ALD) layer, before and after the inorganic layer is provided, and on the basis of the above-mentioned triple-layer structure, the atomic layer deposition layer may be made of a material such as an alumina or silicon oxide. For example, by adding an atomic layer deposition layer on the three-layer encapsulating film layer, at least the following four arrangement order may be included: first, inorganic layer/atomic layer deposition layer/organic flat layer/inorganic layer; second, inorganic layer/organic flat layer/atomic layer deposited layer/inorganic layer; third, atomic layer deposited layer/inorganic layer/organic flat layer/inorganic layer; and fourth, inorganic layer/organic flat layer/inorganic layer/atomic layer deposited layer.

Figure 10:
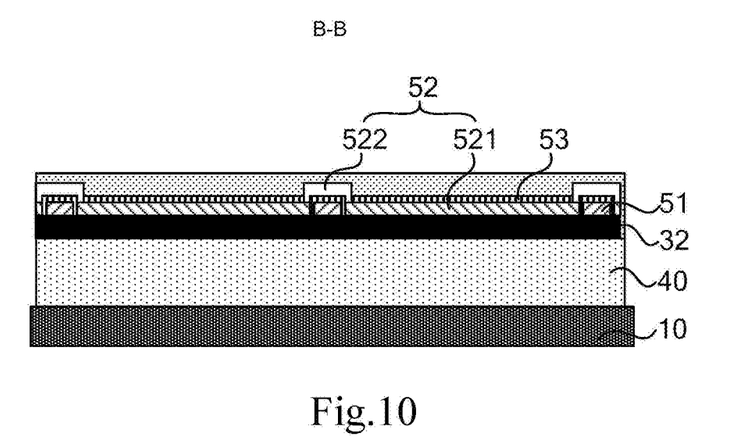
FIG. 10 is a first cross-sectional view taken along the fold line B-B of FIG. 9.
Figure 11:
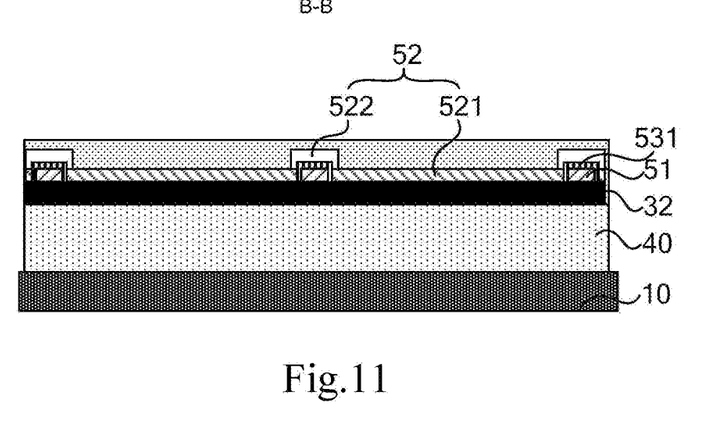
FIG. 11 is a second cross-sectional view taken along the fold line B-B of FIG. 9.

Further, as shown in FIG. 9, the second touch electrode 52 includes a plurality of second sub-touch electrodes 521, which are disposed at the same layer with the first touch electrode 51 and spaced apart by the first touch electrode 51. The touch electrodes 521 are connected by a bridge 522. As shown in FIG. 10, the bridge 522 and the first touch electrode 51 are insulated from each other by providing the insulating layer 53. Alternatively, as shown in FIG. 11, the bridge 522 and the first touch electrode 51 are mutually insulated by an insulating pattern 531.

As shown in FIG. 9, the first touch electrode 51 is provided in the same layer as the second touch electrode 52, and the second touch electrode 52 is formed by a plurality of second sub-touch electrodes 521 spaced with each other, the second sub-touch electrodes 521 are separated by the first touch electrode 51, and the second sub-touch electrodes 521 on both sides of the first touch electrode 51 are connected with each other by the bridge 522. As shown in FIG. 10, the bridge 522 and the first touch electrode 51 are insulated from each other by the insulating layer 53. In this way, a spatially intersecting and insulated relationship can be maintained between the first touch electrode 51 and the second touch electrode 52, and a plurality of second sub-touch electrodes 521 constituting the second touch electrode 52 and the bridge 522 between two adjacent sub-touch electrodes 521 are connected to each other. Alternatively, as shown in FIG. 11, the bridge 522 can be insulated from the first touch electrode 51 by the insulation pattern 531. The function of the insulating layer 53 and the insulating pattern 531 is to insulate the bridge 522 from the first touch electrode 51. The two functions are the same, and those skilled in the art can select and set them as needed.

It should be noted that the bridge 522 may be an upper bridging as shown in FIG. 10, or may be a lower bridging. That is, the insulating layer 53 or the insulating pattern 531 is provided under the first touch electrode 51 and the second touch electrode 52 disposed in the same layer. The bridge 522 connects the two adjacent second sub-touch electrodes 521 by crossing the insulating layer 53 or the insulating pattern 531 downward. In the embodiment of the present disclosure, there is no specific restriction on whether the bridge 522 is an upper or a lower bridging, and those skilled in the art can perform specific settings according to actual needs.

Figure 12A:
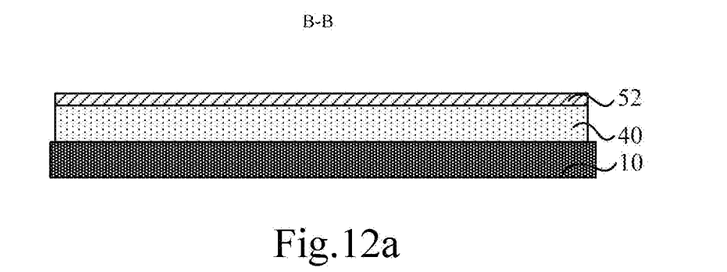
FIG. 12a is a third cross-sectional view taken along the fold line B-B of FIG. 9.
Figure 12B:
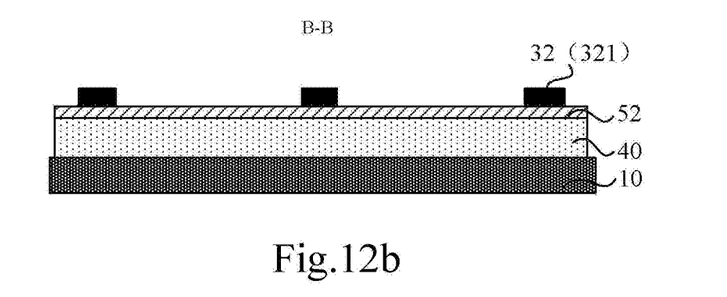
FIG. 12b is a fourth cross-sectional view taken along the fold line B-B of FIG. 9.
Figure 12C:
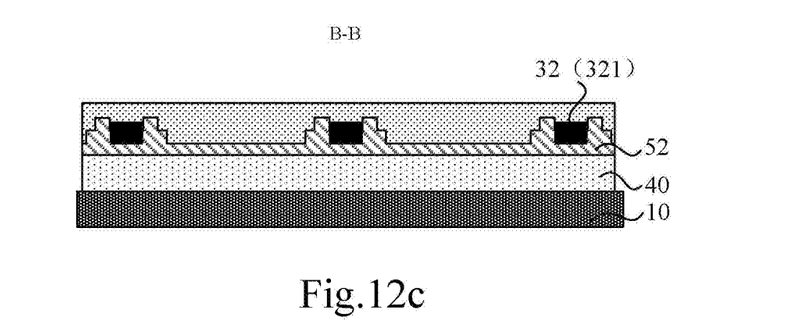
FIG. 12c is a fifth cross-sectional view taken along the fold line B-B of FIG. 9.
Figure 12D:
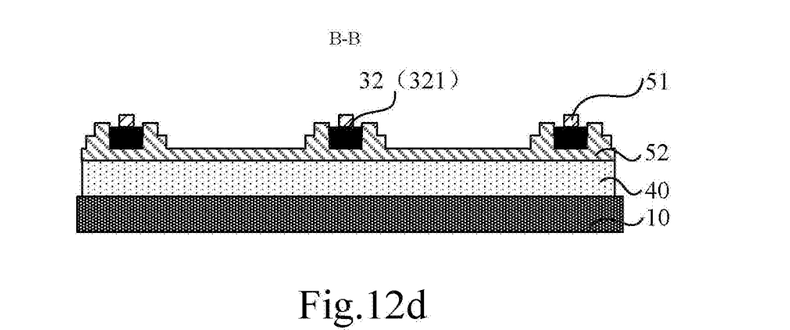
FIG. 12d is a sixth cross-sectional view taken along the fold line B-B of FIG. 9.

In addition, for example, the bridging form of the touch structure 50 can also be designed as shown in FIG. 12d. Specifically, as shown in FIG. 12a, the EL display unit group 20 fabricated on the substrate 10 is subjected to film encapsulation, that is, after the encapsulating film layer 40 is provided, the first layer of the touch electrode layer is first fabricated. Then, as shown in FIG. 12b, a black matrix 321 is provided over the first layer of the touch electrode layer. As shown in FIG. 12c, the second and third layers of the touch electrode layers are fabricated at the edge of the black matrix 321, thereby fabricating the second touch electrode 52 having a multilayer structure. As shown in FIG. 12d, the first touch electrode 51 is fabricated on the black matrix 321, wherein the first touch electrode 51 and the second touch electrode 52 are insulated to form a touch structure 50 in multilayer bridging form.

The insulating layer 53 or the insulating pattern 531 is made of the organic material.

The insulating layer 53 or the insulating pattern 531 may be made of an inorganic material such as silicon nitride, silicon oxynitride, silicon oxide, or the like. Ideally, the insulating layer 53 or the insulating pattern 531 is made of an organic material, such as an acrylic resin, an epoxy resin, a silicone resin, etc., and the flexible substrate is used in the display panel of the embodiment of the present disclosure due to the better stress absorption performance of the organic material. When the display panel is foldable and is bent, the insulating layer 53 or the insulating pattern 531 of the organic material can better absorb stress, and reduce the risk of stress cracking inside the display panel due to excessive stress.

Figure 13:
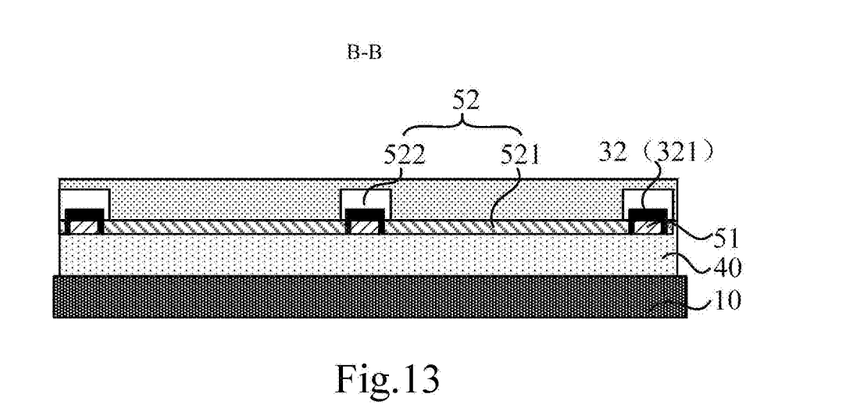
FIG. 13 is a seventh cross-sectional view taken along the fold line B-B of FIG. 9.

Further, as shown in FIG. 13, the color defining structure 32 is provided between adjacent filters 31, and the first touch electrode 51 and the second touch electrode 52 are insulated from each other by the color defining structure 32.

The first touch electrode 51 and the second touch electrode 52 are insulated from each other by the color defining structure 32. For example, as shown in FIG. 13, the first touch electrode 51 and the second touch electrode 52 are provided in the same layer, and the first touch electrode 52 includes a plurality of second sub-touch electrodes 521 and the bridge 522 connecting two adjacent second sub-touch electrodes 521, wherein, by providing the first touch electrode 51 and the bridge 522 on both sides of the color defining structure 32, the first touch electrode 51 and the second touch electrode 52 are insulated from each other. In this way, the color defining structure 32 can be used as the insulating layer 53 or the insulating pattern 531 without adding the hierarchical structure of the insulating layer 53 or the insulating pattern 531 in the touch structure 50, so that the thickness of the display panel of the embodiment of the present disclosure can be reduced.

As shown in FIG. 6, a pixel defining layer 60 having a plurality of openings is also provided on the substrate 10, and the EL display unit 21 is set at the opening. Ideally, the pixel defining layer 60 is made of a light shielding material.

As shown in FIG. 6, the EL display unit 21 is provided at the opening of the pixel defining layer 60, and the pixel defining layer 60 is made of the light shielding material, so that when external natural light is incident into the display panel of the embodiment of the present disclosure, the light irradiated at the position of the pixel defining layer 60 can be blocked and absorbed by the light shielding material, thereby further avoiding the external light reflection phenomenon of the display panel of the embodiment of the present disclosure.

Figure 14:
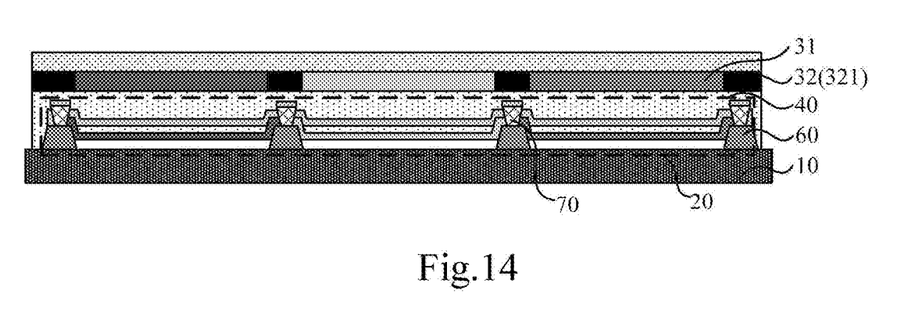
FIG. 14 is a seventh schematic view illustrating a hierarchical structure of a display panel according to an embodiment of the present disclosure.

Further, as shown in FIG. 14, a spacer 70 is further provided on the pixel defining layer 60, and a top surface area of the spacer is larger than a bottom surface area.

In this way, as shown in FIG. 14, since the material adhesion between the layers of the encapsulating film layer 40 and the EL display unit group 20 is not sufficiently strong, when the display panel of the embodiment of the present disclosure is bent, layers between the encapsulating film layer 40 and the EL display unit group 20 are easily peeled off, so that the light-emitting layer is more subjected to water and oxygen erosion, thereby causing the entire display panel to lose efficacy. The spacer 70, having the top surface area larger than the bottom surface area, can reduce the risk of peeling between the layers between the encapsulating film layer 40 and the EL display unit group 20 when the display panel is bent.

It should be noted that the shape of the spacer 70 of the embodiment of the present disclosure is not limited to the inverted trapezoid as shown in FIG. 14, as long as the shape of the spacer 70 satisfies that the top surface area is larger than the bottom surface area. For example, the shape of the spacer in a plan view may be a circle, a square, a rectangle, an ellipse or the like. The density of the spacer 70 is not limited by the embodiment of the present disclosure.

As shown in FIG. 6, the color defining structure 32 is provided between adjacent filters 31, and the color defining structure 32 includes a black matrix 321. A projection of the black matrix 321 on the substrate 10 corresponds to the projected position of the pixel defining layer 60 on the substrate 10.

In this way, since the projection of the black matrix 321 on the substrate 10 corresponds to the projection position of the pixel defining layer 60 on the substrate 10, the natural light incident into the inside of the display panel of the embodiment of the present disclosure can also be blocked and absorbed by the black matrix 321, in order to avoid impacting effect of the display panel due to reflected light exiting out.

Figure 15:
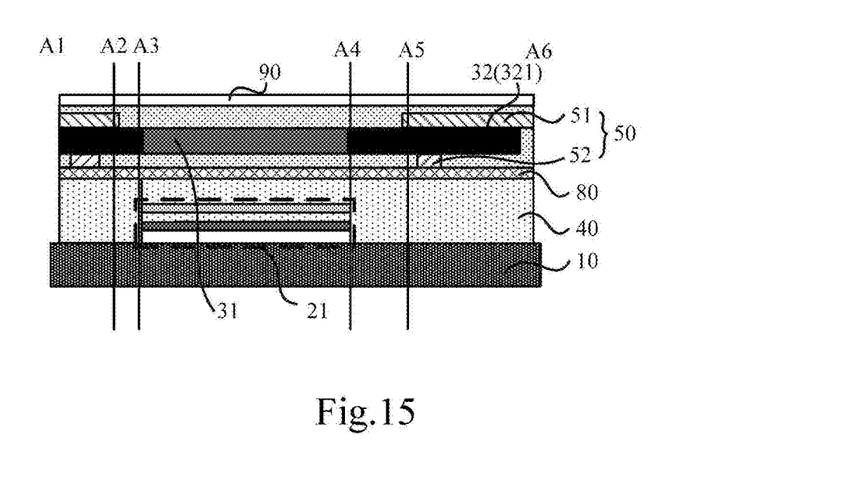
FIG. 15 is a second cross-sectional view taken along the fold line A1-A2-A3-A4-A5-A6 of FIG. 7.

Further, as shown in FIG. 15, the EL display unit 21 is encapsulated by the encapsulating film layer 40, and a buffer layer 80 is further provided between the touch structure 50 and the encapsulating film layer 40.

In this way, as shown in FIG. 15, by providing the buffer layer 80 between the touch structure 50 and the encapsulating film layer 40, during the actual operation of the display panel of the embodiment of the present disclosure, and when the user performs a touch operation, the force applied on the display panel by the touch operation can be weakened by the buffer of the buffer layer 80 to reduce the force of the touch operation and adversely affect the encapsulating closed effect of the encapsulating film layer 40 of the display panel.

As shown in FIG. 15, a protective layer 90 is provided on the filter layer 30.

In this way, the protective layer 90 can effectively protect the filter layer 30 and the touch structure 50 provided under the protective layer 90, thereby avoiding damage to the filter layer 30 and the touch structure 50 by the touch operation, and improving the service life of the filter layer 30 and the touch structure 50 in the display panel of the embodiment of the present disclosure.

Further, the protective layer 90 is adhered and fixed to the touch operation surface of the touch structure 50 through optically transparent adhesive (OCA) or pressure sensitive adhesive (PSA). The protective layer 90 may be configured to have one or more layers.

The number of layers of the protective layer 90 and the thickness of the protective layer 90 are not specifically limited in the embodiment of the present disclosure. Since the protective layer 90 is configured to have a whole layer, in order to prevent the protective layer 90 from affecting the screen display of the display panel, the protective layer 90 should be made of a transparent material. In order to reduce the problem of dislocation and detachment between the protective layer 90 and other structures of the display panel, it is advisable to use the optical transparent adhesive, the optical transparent resin or the pressure sensitive adhesive to adhere and fix the protective layer 90 and the operation surface of the touch structure 50. Since the optical transparent adhesive, the optical transparent resin or the pressure sensitive adhesive is also transparent, it does not affect the display of the display panel. The thickness of the optical transparent adhesive, the optical transparent resin, or the pressure sensitive adhesive is not limited as long as the protective layer 90 and the touch structure 50 are firmly fixed. The protective layer 90 can be made of materials including polyimide, polyurethane, and the like.

Figure 16:
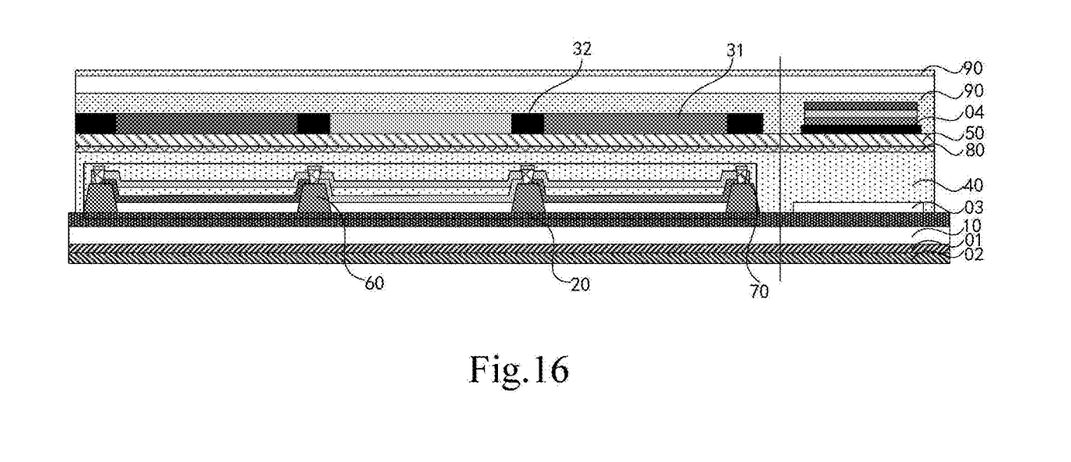
FIG. 16 is an eighth schematic view illustrating a hierarchical structure of a display panel according to an embodiment of the present disclosure.

In the display panel of the embodiment of the present disclosure, in addition to the above-described description, that is, the hierarchical structure shown in the drawings, other film layer structures supporting the normal display of the display panel may be included, for instance, as shown in FIG. 16, where a pressure sensitive adhesive layer 01 is provided on the functional film layer 02, and the substrate 10 is provided on the pressure sensitive adhesive layer 01. The substrate 10 includes a flexible or glass substrate body and a backplane and a protective component thereof provided on the flexible or glass substrate body. A hierarchical structure of the EL display unit group 20 is provided on the substrate 10, wherein, since the display panel is usually divided into a display area and a frame area surrounding the display area, the EL display unit group 20 is provided in the display area of the display panel and the metal wire 03 is also set in the frame area, wherein the EL display unit group 20 is disposed on the display area of the display panel because the display area and the frame area surrounding the display area are generally divided on the display panel. A metal trace 03 is further provided in the frame region. The encapsulating film layer 40 encapsulates the substrate 10 on which the EL display unit group 20 and the metal trace 03 are provided. After the buffer layer 80 is provided on the encapsulating film layer 40, the touch structure 50 and the filter layer 30 are further provided on the buffer layer 80. Providing the touch structure 50 first and then providing the filter layer 30 is only one of the setup modes in the embodiment of the present disclosure. There are also other cascade arrangement relationships in the above detailed description of the touch structure 50 and the filter layer 30. In general, in order to reduce light leakage phenomenon in the display panel frame area, a light shielding structure 04 is provided at a position where the frame area and the filter layer 30 are in the same layer, so as to reduce the reflection of external ambient light from the metal wiring. The light shielding structure 04 can usually be the black matrix. In order to further improve the effect of shielding light-leaking, as shown in FIG. 16, in addition to the filter layer 30 provided in the display area, one or more layers of filter cascading structure with different color is provided on the frame area of black matrix as the light shielding structure 04, so as to further improve the absorption effect of the light shielding structure 04, reduce the frame area of the external ambient light reflection, and increase blackness and display effect of the light shielding structure 04 of the frame area.

In another aspect of the embodiments of the present disclosure, a display device is provided including the display panel of any of the above.

The display device of the embodiment of the present disclosure includes the display panel of any one of the above, wherein the filter layer 30, consisting of filters 31 corresponding to color of light emitted from the EL display unit 21, is provided on the light-emitting side of the EL display unit 21 in the display panel, such that the external natural light incident from the outside first enters into the display device through the filter layer 30. After being reflected by the internal metal material and then emitted through the filter layer 30 again, the reflected light passing through the filter 31 has a color corresponding to the filter 31, and exits out together with the light emitted by EL display unit 21 at the corresponding position. That is, the reflected light can be adjusted to be the emitted light for realizing the display, so that the thickness of the display device can be reduced, since it is no longer necessary to provide a circular polarizer in the display device to reduce the reflection. When the display device of the embodiment of the present disclosure is used for flexible display, the thinned display device is easily bent, and the folding function is facilitated.

In the above detailed description of the display panel, the display device including the display panel of the embodiment of the present disclosure has been described in detail, and details are not described herein again.

The above is only the specific embodiment of the present disclosure, but the scope of the present disclosure is not limited thereto, and any person skilled in the art can easily think of changes or replacements within the technical scope of the disclosure. It should be covered within the scope of protection of the present disclosure. Therefore, the scope of protection of the present disclosure should be determined by the scope of the claims.

What is claimed is:

1. A display panel, comprising:
   a substrate;
   an electroluminescent (EL) display unit group disposed on one side of the substrate, and comprising a plurality of EL display units for emitting light of different colors;
   a filter layer disposed on a light emitting side of the EL display units, the filter layer comprising a plurality of filters allowing lights of different colors to pass through, a light emitted from the EL display units having a color same as a color of a light allowed to pass through the filter disposed on the light emitting side of the EL display units, wherein edges of two adjacent filters are overlapped with each other; and
   a touch structure comprising a plurality of first touch electrodes positioned parallel to each other and a plurality of second touch electrodes positioned parallel to each other, and the plurality of first touch electrodes and the plurality of second touch electrodes being crossed and insulated from each other;
   wherein a filter is disposed on a side, away from the substrate, of a first touch electrode of the plurality of first touch electrodes and a second touch electrode of the plurality of second touch electrodes, and an orthographic projection of part of the filter that overlaps with an adjacent filter on the substrate overlaps an orthographic projection of the first touch electrode on the substrate and, the orthographic projection of part of the filter that overlaps with the adjacent filter on the substrate overlaps an orthographic projection of the second touch electrode on the substrate; and an overlapping area between the orthographic projection of the first touch electrode on the substrate and an orthographic projection of a EL display unit of the plurality of EL display units on the substrate is zero, and an overlapping area between the orthographic projection of the second touch electrode on the substrate and the orthographic projection of the EL display unit on the substrate is zero.

2. The display panel according to claim 1, wherein the filter layer is carried by the substrate, and the EL display units are disposed on a side of the filter layer facing away from the substrate, in direct contact with an encapsulating film layer and encapsulated by the encapsulating film layer.

3. The display panel according to claim 1, wherein:
   the second touch electrode comprises a plurality of second sub-touch electrodes spaced apart from the first touch electrode and disposed at the same layer with the first touch electrode;
   the second sub-touch electrodes are connected by a bridge; and
   the bridge and the first touch electrode are insulated from each other by providing an insulating layer or an insulating pattern.

4. The display panel according to claim 1, wherein:
   a protective layer is further disposed on a side of the filter layer away from the EL display units;

the protective layer is adhered and fixed to a touch operation surface of the touch structure through an optically transparent adhesive or a pressure sensitive adhesive; and the protective layer is configured to have one or more layers.

5. The display panel according to claim 1, wherein, a pixel defining layer comprising a plurality of openings is further disposed on the substrate, the EL display units are disposed at the openings, and the pixel defining layer is made of a light shielding material.

6. The display panel according to claim 5, further comprising a spacer disposed on the pixel defining layer, wherein a top surface area of the spacer is larger than a bottom surface area.

7. The display panel according to claim 5, wherein:
a color defining structure is disposed between adjacent filters, the color defining structure comprises a black matrix; and
a projection position of the black matrix on the substrate corresponds to a projected position of the pixel defining layer on the substrate.

8. The display panel according to claim 1, wherein a color defining structure is provided between adjacent filters, and the color defining structure is used for defining two adjacent filters.

9. The display panel according to claim 8, wherein, the color defining structure comprises black matrix; or the color defining structure is formed be edges of two adjacent filters overlapped with each other.

10. The display panel according to claim 8, wherein the touch structure is disposed in the display panel, and a projection of the touch structure on the substrate is located within a projection range of the color defining structure on the substrate.

11. The display panel according to claim 10, wherein:
the EL display units are encapsulated by an encapsulating film layer; and
a buffer layer is further disposed between the touch structure and the encapsulating film layer.

12. The display panel according to claim 10, wherein the first touch electrode and the second touch electrode are insulated from each other by the color defining structure.

13. A display device, comprising:
a display panel, wherein the display panel comprises:
a substrate;
an electroluminescent (EL) display unit group disposed on one side of the substrate, and comprising a plurality of EL display units for emitting light of different colors;
a filter layer disposed on a light emitting side of the EL display units, the filter layer comprising a plurality of filters allowing lights of different colors to pass through, and a light emitted from the EL display units having a color same as a color of a light allowed to pass through the filter disposed on the light emitting side of the EL display units, wherein edges of two adjacent filters are overlapped with each other; and
a touch structure comprising a plurality of first touch electrodes positioned parallel to each other and a plurality of second touch electrodes positioned parallel to each other, the plurality of first touch electrodes and the plurality of second touch electrodes being crossed and insulated from each other;
wherein a filter is disposed on a side, away from the substrate, of a first touch electrode of the plurality of first touch electrodes and a second touch electrode of the plurality of second touch electrodes, and an orthographic projection of part of the filter that overlaps with an adjacent filter on the substrate overlaps an orthographic projection of the first touch electrode on the substrate and, the orthographic projection of part of the filter that overlaps with the adjacent filter on the substrate overlaps an orthographic projection of the second touch electrode on the substrate; and an overlapping area between the orthographic projection of the first touch electrode on the substrate and an orthographic projection of a EL display unit of the plurality of EL display units on the substrate is zero, and an overlapping area between the orthographic projection of the second touch electrode on the substrate and the orthographic projection of the EL display unit on the substrate is zero.

14. The display device according to claim 13, wherein the display device is an organic light-emitting diode (OLED) display device.

15. The display device according to claim 13, wherein, a pixel defining layer comprising a plurality of openings is further disposed on the substrate, the EL display units are disposed at the openings, and the pixel defining layer is made of a light shielding material.

16. The display device according to claim 13, wherein a color defining structure is provided between adjacent filters, and the color defining structure is used for defining two adjacent filters.

17. The display device according to claim 16, wherein, the color defining structure comprises black matrix; or the color defining structure is formed be edges of two adjacent filters overlapped with each other.

18. The display device according claim 13, wherein the filter layer is carried by the substrate, and the EL display units are disposed on a side of the filter layer facing away from the substrate, in direct contact with an encapsulating film layer and encapsulated by the encapsulating film layer.

19. A method, comprising:
providing the display panel of claim 1, wherein the display panel comprises:
a substrate;
an electroluminescent (EL) display unit group disposed on one side of the substrate, and comprising a plurality of EL display units for emitting light of different colors;
a filter layer disposed on a light emitting side of the EL display units, the filter layer comprising a plurality of filters allowing lights of different colors to pass through, and a light emitted from the EL display units having a color same as a color of a light allowed to pass through the filter disposed on the light emitting side of the EL display units, wherein edges of two adjacent filters are overlapped with each other; and
a touch structure comprising a plurality of first touch electrodes positioned parallel to each other and a plurality of second touch electrodes positioned parallel to each other, the plurality of first touch electrodes and the plurality of second touch electrodes being crossed and insulated from each other;
wherein a filter is disposed on a side, away from the substrate, of a first touch electrode of the plurality of first touch electrodes and a second touch electrode of the plurality of second touch electrodes, and an orthographic projection of part of the filter that overlaps with an adjacent filter on the substrate overlaps an orthographic projection of the first touch electrode on the substrate and, the orthographic projection of part of the filter that overlaps with the adjacent filter on the substrate overlaps an orthographic projection of the second touch electrode on the substrate; and an overlapping area between the orthographic projection of the first touch electrode on the substrate and an orthographic projection of a EL display unit of the plurality of EL display units on the substrate is zero, and an overlapping area between the orthographic projection of the second touch electrode on the substrate and the orthographic projection of the EL display unit on the substrate is zero.

* * * * *